US012781339B2

(12) United States Patent
Uchida et al.

(10) Patent No.: US 12,781,339 B2
(45) Date of Patent: Nov. 3, 2026

(54) TREATMENT SOLUTION AND TREATMENT METHOD

(71) Applicants: KABUSHIKI KAISHA TOSHIBA, Tokyo (JP); TOHOKU UNIVERSITY, Sendai (JP)

(72) Inventors: Kenya Uchida, Yokohama (JP); Hiroyuki Fukui, Yokkaichi (JP); Ikuo Uematsu, Yokohama (JP); Takeaki Iwamoto, Sendai (JP); Eunsang Kwon, Sendai (JP)

(73) Assignees: KABUSHIKI KAISHA TOSHIBA, Tokyo (JP); TOHOKU UNIVERSITY, Sendai (JP)

( * ) Notice: Subject to any disclaimer, the term of this patent is extended or adjusted under 35 U.S.C. 154(b) by 13 days.

(21) Appl. No.: 18/759,780

(22) Filed: Jun. 28, 2024

(65) Prior Publication Data

US 2024/0352578 A1 Oct. 24, 2024

Related U.S. Application Data

(63) Continuation of application No. 17/024,783, filed on Sep. 18, 2020, now abandoned, which is a
(Continued)

(30) Foreign Application Priority Data

Mar. 23, 2018 (JP) ................................ 2018-055615
Mar. 23, 2018 (JP) ................................ 2018-055698
(Continued)

(51) Int. Cl.
*C23C 16/30* (2006.01)
*A62D 3/36* (2007.01)
(Continued)

(52) U.S. Cl.
CPC ................ *C23C 16/30* (2013.01); *A62D 3/36* (2013.01); *C23C 16/56* (2013.01); *C30B 19/10* (2013.01);
(Continued)

(58) Field of Classification Search
None
See application file for complete search history.

(56) References Cited

U.S. PATENT DOCUMENTS 4,447,262 A * 5/1984 Gay ........................ C01F 11/24 75/637
5,066,472 A 11/1991 Ruff et al.
(Continued)

FOREIGN PATENT DOCUMENTS

JP 01-257119 A 10/1989
JP 09-045658 A 2/1997
(Continued)

OTHER PUBLICATIONS

K.P.C. Vollhardt, et al. (Authors), K. Koga et al. (Supervisors of the Translation). K. Oshima et al. {Translators) "Vollhardt-Shore Gendai Yuki Kagagu" Third Edition [Vollhardt-Shore Organic Chemistry, Third Edition], Apr. 1, 1996, pp. 223-296 (with English Translation).

(Continued)

*Primary Examiner* — John J Figueroa
(74) *Attorney, Agent, or Firm* — Oblon, McClelland, Maier & Neustadt, L.L.P.

(57) ABSTRACT

According to one embodiment, a treatment method may include making a byproduct come into contact with a treatment solution, wherein the byproduct is a solid or liquid byproduct formed by polymerizing components contained in an exhaust gas discharged by synthesizing a silicon-containing material using a gas which includes silicon and halogen.
(Continued)

The treatment solution may include at least one of an inorganic base or an organic base, and is basic.

8 Claims, 4 Drawing Sheets

Related U.S. Application Data continuation of application No. PCT/JP2018/039733, filed on Oct. 25, 2018.

(30) Foreign Application Priority Data

Jul. 31, 2018 (JP) ................................ 2018-144515
Jul. 31, 2018 (JP) ................................ 2018-144521

(51) Int. Cl.

| | |
|---|---|
| ***A62D 101/40*** | (2007.01) |
| ***C23C 16/44*** | (2006.01) |
| ***C23C 16/56*** | (2006.01) |
| ***C30B 19/10*** | (2006.01) |
| ***C30B 19/12*** | (2006.01) |
| ***H10P 72/00*** | (2026.01) |

(52) U.S. Cl.

CPC .......... *C30B 19/12* (2013.01); *H10P 72/0402* (2026.01); *A62D 2101/40* (2013.01); *C23C 16/4412* (2013.01)

(56) References Cited

U.S. PATENT DOCUMENTS

| | | | | |
|---|---|---|---|---|
| 5,545,291 | A | 8/1996 | Smith et al. | |
| 5,702,615 | A * | 12/1997 | Numata | C02F 1/725 423/244.1 |
| 5,938,853 | A * | 8/1999 | Williams | B01D 3/06 118/726 |
| 6,124,518 | A * | 9/2000 | Rasmussen | A62D 3/34 588/318 |
| 6,132,688 | A | 10/2000 | Hsiue et al. | |
| 6,368,998 | B1 | 4/2002 | Lockemeyer et al. | |
| 2003/0049199 | A1 | 3/2003 | Ando et al. | |
| 2006/0131561 | A1* | 6/2006 | Hirai | H10K 71/10 257/40 |
| 2006/0183958 | A1 | 8/2006 | Breneman et al. | |
| 2008/0125610 | A1 | 5/2008 | Lockemeyer et al. | |
| 2010/0075463 | A1 | 3/2010 | Smith et al. | |
| 2011/0023908 | A1 | 2/2011 | Neuber et al. | |
| 2012/0052203 | A1 | 3/2012 | Miyashita et al. | |
| 2013/0156950 | A1 | 6/2013 | Yamada et al. | |
| 2017/0067152 | A1 | 3/2017 | Hayashi | |
| 2017/0110316 | A1 | 4/2017 | Park et al. | |
| 2017/0252798 | A1 | 9/2017 | Yoon et al. | |
| 2017/0333877 | A1 | 11/2017 | Titlbach et al. | |

FOREIGN PATENT DOCUMENTS

| | | | |
|---|---|---|---|
| JP | 09-506742 | A | 6/1997 |
| JP | 10-60656 | A | 3/1998 |
| JP | 2006-86166 | A | 3/2006 |
| JP | 2007-214290 | A | 8/2007 |
| JP | 2009-279567 | A | 12/2009 |
| JP | 2012-049342 | A | 3/2012 |
| JP | 2012-62457 | A | 3/2012 |
| JP | 2012-158815 | A | 8/2012 |
| JP | 2013-125810 | A | 6/2013 |
| JP | 2013-197474 | A | 9/2013 |
| JP | 2015-51394 | A | 3/2015 |
| JP | 2016-013965 | A | 1/2016 |
| JP | 2017-054862 | A | 3/2017 |
| JP | 2017-172004 | A | 9/2017 |
| TW | 201111549 | A1 | 4/2011 |
| TW | 201418270 | A | 5/2014 |
| WO | WO 2014/197808 | A1 | 12/2014 |

OTHER PUBLICATIONS

International Search Report issued Dec. 11, 2018 in PCT/JP2018/039733 filed on Oct. 25, 2018, 3 pages.

International Search Report issued Dec. 18, 2018 in PCT/JP2018/039731 filed on Oct. 25, 2018, 2 pages.

Mitsubishi Materials Corporation Yokkaichi Plant Explosion & Fire Accident Investigation Committee. "Investigative Report for the High-Purity Polycrystalline Silicon Manufacturing Facility Explosion & Fire Accident Occurred at Yokkaichi Plant of Mitsubishi Materials Corporation", Jun. 12, 2014, 3 pages.

Meyer-Wegner et al. "The Perchlorinated Silanes $Si_2Cl_6$ and $Si_3Cl_8$ as sources of $SiCl_2$", chemistry A European Journal, vol. 17, Issue 17, Apr. 18, 2011, pp. 4715-4719.

Habuka, H., et al., "By-Product Formation in a Trichlorosilane-Hydrogen System for Silicon Film Deposition", ECS Journal of Solid State Science and Technology, vol. 4, No. 2, 2015, XP55862391, pp. P16-P19 with cover page.

Office Action mailed May 2, 2025 in co-pending U.S. Appl. No. 18/605,574 , 13 pages.

* cited by examiner

TREATMENT SOLUTION AND TREATMENT METHOD

CROSS-REFERENCE TO RELATED APPLICATIONS

This application is a continuation of and claims benefit under 35 U.S.C. § 120 to U.S. application Ser. No. 17/024,783, filed Sep. 18, 2020, which is a continuation of and claims benefit under 35 U.S.C. §§ 120 and 365 (c) to PCT Application No. PCT/JP2018/039733, filed Oct. 25, 2018, and is based upon and claims the benefit of priority under 35 U.S.C. § 119 from Japanese Patent Application No. 2018-055615, filed Mar. 23, 2018, Japanese Patent Application No. 2018-055698, filed Mar. 23, 2018, Japanese Patent Application No. 2018-144515, filed Jul. 31, 2018, and Japanese Patent Application No. 2018-144521, filed Jul. 31, 2018, the entire content of each of which is incorporated herein by reference.

FIELD

Embodiments described herein relate generally to treatment solutions and treatment methods.

BACKGROUND

Semiconductor silicon substrates are widely used as materials for forming various electronic circuits. A film including a silicon-containing material may be formed on the semiconductor silicon substrate in order to facilitate the formation of an electronic circuit. As an apparatus for forming such a film, an epitaxial growth apparatus has been used.

The epitaxial growth apparatus includes a reaction chamber, a supply pipe connected to the reaction chamber and through which a material gas is supplied, and a discharge pipe connected to the reaction chamber and through which an exhaust gas is discharged. The epitaxial growth apparatus places a substrate in the reaction chamber depressurized under inert atmosphere, and has a material gas that is introduced into the reaction chamber react with the heated substrate, thereby forming a film including a silicon-containing material on the substrate. As the material gas, for example, a hydrogen gas which includes a compound including silicon and chlorine is used. The material gas introduced into the reaction chamber is discharged as the exhaust gas to the outside of the apparatus through the discharge pipe. The exhaust gas may contain the compound including silicon and chlorine.

Here, the temperature in the reaction chamber is significantly higher than that in the discharge pipe. Therefore, the compound including silicon and chlorine contained in the exhaust gas discharged into the discharge pipe may be cooled inside the discharge pipe and precipitated as a byproduct. The byproduct, also referred to as “oily silane”, can be a highly viscous liquid material. It has been required to render such a byproduct harmless in a highly safe manner.

DETAILED DESCRIPTION

An object of an embodiment is to provide a treatment solution and a treatment method that make it possible to treat a byproduct stemming from the process of depositing a silicon-containing material on a member using a gas which includes silicon and halogen.

According to a first embodiment, there is provided a treatment solution for treating a byproduct stemming from a process of depositing a silicon-containing material on a member using a gas which includes silicon and halogen. The treatment solution includes at least one of an inorganic base or an organic base. The treatment solution is basic.

According to a second embodiment, a treatment method using the treatment solution according to the embodiment. The method includes making the byproduct come into contact with the treatment solution.

Conventionally, as described in Jpn. Pat. Appln. KOKAI Publication No. 2012-49342, the main component of the above-described byproduct has been assumed to be a chlorosilane polymer. However, since the byproduct is highly reactive to water and oxygen, no method for directly analyzing the byproduct itself has been established. After intensive studies, the present inventors have established a method for directly analyzing the byproduct itself, and have consequently found the main component of the byproduct to be chlorosilanes having a cyclic structure. The present invention is based on this finding.

A treatment solution according to an embodiment is for treating a byproduct stemming from a process of depositing a silicon-containing material on a member using a gas which includes silicon and chlorine. The treatment solution contains at least one of an inorganic base or an organic base. The treatment solution according to the embodiment is basic.

The byproduct may include chlorosilanes having a cyclic structure. The chlorosilanes having a cyclic structure have a thermodynamically stable structure. Therefore, the chlorosilanes having a cyclic structure do not change in quality under inert gas atmosphere. However, the chlorosilanes having a cyclic structure may rapidly react with water or oxygen to turn into a more explosive substance. The present inventors have found that treatment of the chlorosilanes having a cyclic structure collected under inert atmosphere with the basic treatment solution renders them harmless in a highly safe manner.

That is, the treatment solution according to the embodiment can also be referred to as a “treatment solution for treating chlorosilanes having a cyclic structure”.

Using the treatment solution according to the embodiment can render the byproduct harmless in a highly safe manner.

Hereinafter, the treatment solution and the treatment method will be described in detail. The following description will be made, taking an epitaxial growth apparatus as an example of an apparatus in which the byproduct is produced.

Figure 1:
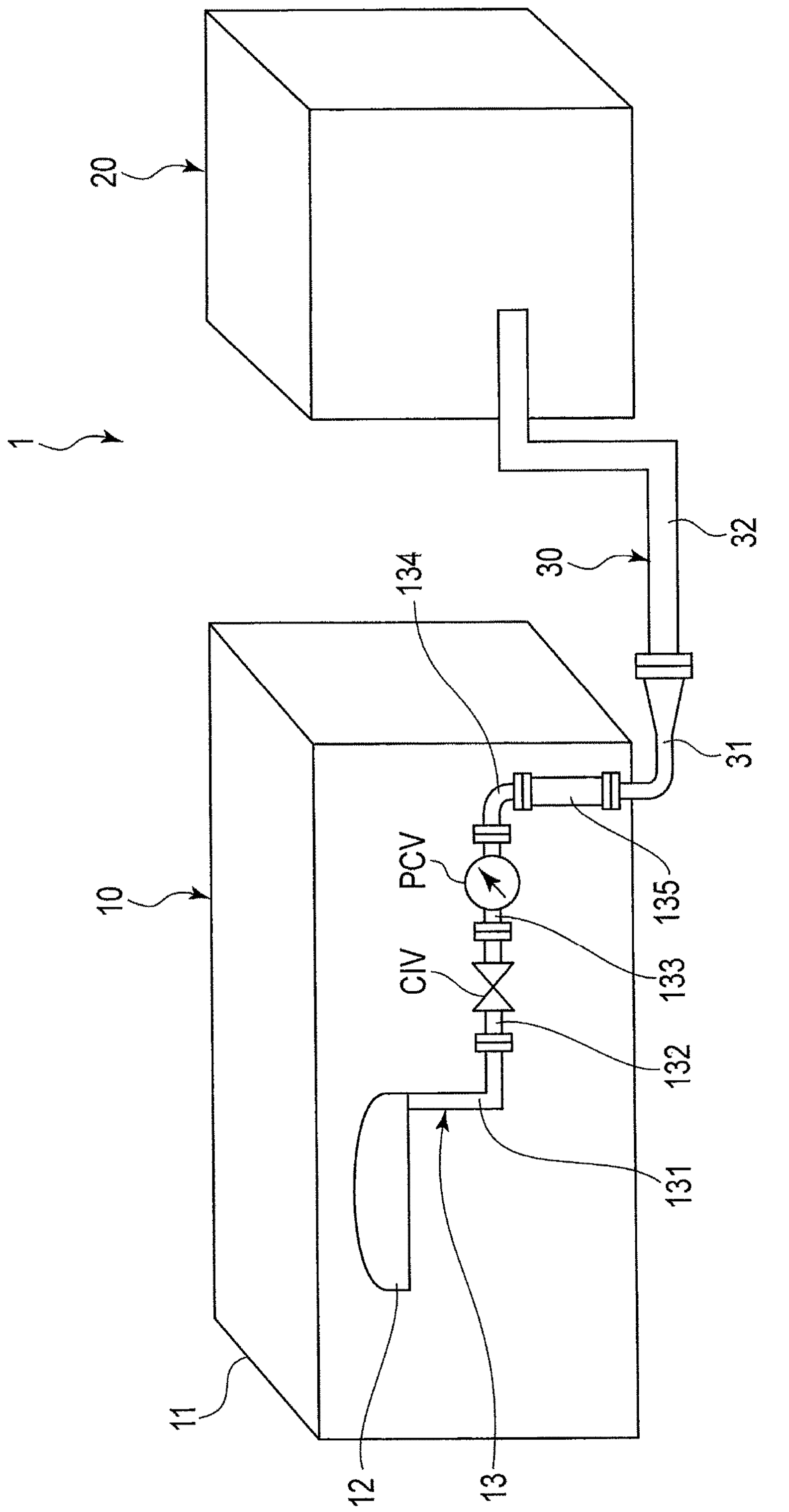
FIG. 1 is a perspective view schematically showing an example epitaxial growth apparatus.

FIG. 1 is a perspective view schematically showing an example epitaxial growth apparatus. The epitaxial growth apparatus 1 shown in FIG. 1 includes an apparatus main body 10, an abatement apparatus 20, and a connection portion 30.

The apparatus main body 10 includes a housing 11, a reaction chamber 12, a discharge pipe 13, and a supply pipe (not shown). The reaction chamber 12, the discharge pipe 13, and the supply pipe are housed in the housing 11. One end of the supply pipe is connected to the reaction chamber 12. The other end of the supply pipe is connected to a material-gas supply device (not shown).

One end of the discharge pipe 13 is connected to the reaction chamber 12. The other end of the discharge pipe 13 is connected to the connection portion 30. The discharge pipe 13 includes pipes 131 to 135. One end of the pipe 131 is connected to the reaction chamber 12. The other end of the pipe 131 is connected to one end of the pipe 132. The pipe 132 includes a chamber isolation valve (CIV). The other end of the pipe 132 is connected to one end of the pipe 133. The pipe 133 includes a pressure control valve (PCV). The other end of the pipe 133 is connected to one end of the pipe 134. The other end of the pipe 134 is connected to one end of the pipe 135. The other end of the pipe 135 is connected to one end of the connection portion 30.

The connection portion 30 includes a pipe 31 and a pipe 32. One end of the pipe 31 is connected to the other end of the pipe 135. The other end of the pipe 31 is connected to one end of the pipe 32. The other end of the pipe 32 is connected to the abatement device 20.

In the epitaxial growth apparatus 1, a material gas is discharged from the material-gas supply device and introduced into the reaction chamber 12 through the supply pipe. The material gas is a gas which includes silicon and chlorine. The gas which includes silicon and chlorine is, for example, a gas having hydrogen gas mixed with a compound including silicon and chlorine. The concentration of hydrogen in the mixed gas is, for example, 95 vol % or more. The compound including silicon and chlorine is, for example, dichlorosilane ($SiH_2Cl_2$), trichlorosilane ($SiHCl_3$), tetrachlorosilane ($SiCl_4$), or a mixture thereof. The mixed gas may contain at least one of monosilane ($SiH_4$) or hydrochloric acid (HCl).

A substrate is placed in the reaction chamber 12 under reduced pressure, and then heated to a temperature equal to or higher than that for the reaction with the material gas. An example reaction temperature is 600° C. or more, and another example reaction temperature is 1000° C. or more. When the substrate reacts with the material gas, a monocrystalline or polycrystalline silicon-containing film is formed on the substrate through a thermochemical reaction. The substrate is, for example, a monocrystalline silicon substrate.

The exhaust gas discharged from the reaction chamber 12 is introduced into the abatement device 20 via the discharge path formed of the discharge pipe 13 and the connection portion 30. The exhaust gas can contain the compound including silicon and chlorine which is contained in the material gas but has not been deposited on the substrate, monosilane, hydrogen chloride, etc. The exhaust gas is burnt in the abatement device 20 and rendered harmless.

The byproduct may precipitate in part of the discharge pipe 13 and part of the connection portion 30. The byproduct is considered to be a solid or liquid formed by polymerizing components contained in the above-described exhaust gas. The byproduct tends to precipitate in the vicinity of the pipe 134 of the discharge pipe 13. In the pipes 131 to 133, located near the reaction chamber 12, the temperature of the exhaust gas is sufficiently high, and the polymer is thus considered to precipitate only minimally. In the connection portion, located far from the reaction chamber 12, the amount of raw material components for the byproduct in the exhaust gas is small, and the byproduct is considered to be produced in minimal quantities only.

The byproduct is considered to include cyclic chlorosilanes. The fact that the byproduct contains cyclic chlorosilanes can be presumed by the following method.

First, the discharge pipe 13 of the epitaxial growth apparatus 1 is disassembled to remove the pipe to which the byproduct adheres. For example, as in the pipe 134 shown in FIG. 1, a curved pipe located downstream of the pressure control valve PCV in the flow direction of the exhaust gas is removed. Then, both ends of the removed pipe are closed. This operation is performed under inert atmosphere such as nitrogen ($N_2$) gas.

Next, the removed pipe is transferred into a glove box purged with an inert gas such as nitrogen gas. Subsequently, the byproduct is collected from the pipe, and analysis samples for use in nuclear magnetic resonance (NMR) spectroscopy and mass spectrometry (MS), respectively, are prepared. The atmosphere in the glove box is preferably an argon atmosphere with a moisture concentration of 1 ppm or less and an oxygen concentration of 10 ppm or less. As the glove box, for example, VAC101965OMNI-LAB STCH-A manufactured by VAC, Inc. is used. In bringing the analysis samples to their respective analyzers, each of the samples is placed in, for example, a container made of resin which when subsequently in the state of being placed in a sealed container is transferred from the glove box to the analyzer. In preparing each analysis sample, caution is taken not to bring the sample into contact with oxygen and water. At times when each analysis sample must unavoidably be exposed to air, such as when being placed in the analyzer, quick handling should be executed.

Next, the byproduct is analyzed by a nuclear magnetic resonance (NMR) method. As an analysis sample, for example, a mixture having 0.2 g of the byproduct mixed with 2 mL of dehydrated heavy toluene (manufactured by Kanto Chemical Co., Inc.: Product No. 21744-1A) and then left for four hours is used. Next, this mixture is dispensed into a sample tube with a J. YOUNG valve (S-5-600-JY-8) manufactured by HARUNA Inc. Then, the NMR sample tube is set in an NMR spectrometer, and a $^{29}$Si NMR spectrum is measured. As the NMR spectrometer, for example, JNM-ECA800 manufactured by JEOL Ltd. can be used. In the measurement of the $^{29}$Si NMR spectrum, for example, the number of times of integration is set to 3500, and the measurement range is set to −500 to 500 ppm.

Next, the byproduct is analyzed by mass spectrometry (MS) to obtain a mass spectrum. As the analysis sample, for example, a solution obtained by dissolving the byproduct in toluene subjected to degassing and a dehydration treatment is used. The concentration of the byproduct in the solution is 5 mass %, and the water content is 0.6 ppm or less. In the degassing and the dehydration treatment of toluene, for example, a purification apparatus VAC SOLVENT PURIFIER 103991 manufactured by VAC, Inc. is used. As the mass spectrometer, for example, a solariX 9.4T manufactured by Bruker Daltonics is used. As an ionization method, an APCI (Atmospheric Pressure Chemical Ionization) method is used. In the measurement of the mass spectrum, for example, the number of times of integration is set to 300, and the measurement range is set to 100 to 2000 m/z.

When both of the following requirements (1) and (2) are satisfied from these analysis results, the byproduct can be presumed to contain chlorosilanes having a cyclic structure.

Requirement (1): In the $^{29}$Si NMR spectrum, a signal with the greatest relative intensity appears at a position of −0.4 ppm.

Figure 2:
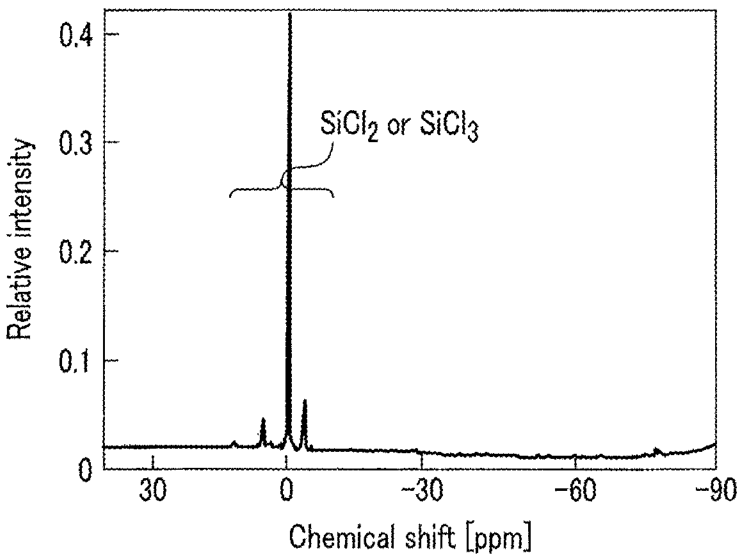
FIG. 2 is a graph showing an example $^{29}$Si NMR spectrum of a byproduct.

The $^{29}$Si NMR spectrum satisfying the requirement (1) will be described with reference to FIG. 2. FIG. 2 is a graph showing an example $^{29}$Si NMR spectrum of the byproduct. In FIG. 2, the horizontal axis indicates a chemical shift (ppm), and the vertical axis indicates a relative intensity. In the $^{29}$Si NMR spectrum shown in FIG. 2, the signal with the greatest relative intensity is detected at the position of −0.4 ppm. No signal is detected in the range of −80 to −40 ppm. From the data provided in Non-Patent Document 1 (Frank Meyer-Wegner, Andor Nadj, Michael Bolte, Norbert Auner, Matthias Wagner, Max C. Holthausen, and Hans-Wolfram W. Lerner, "The Perchlorinated Silanes $Si_2Cl_6$ and $Si_3Cl_8$ as Sources of $SiCl_2$", Chemistry A European Journal, Apr. 18, 2011, Volume 17, Issue 17, p. 4715-4719), a signal appearing at the position of −0.4 ppm is presumed to belong to a $SiCl_3$ unit or a $SiCl_2$ unit.

Requirement (2): In the mass spectrum, signals belonging to ($SiCl_2$), are detected over a mass-to-charge ratio range of about 0 to 1500 m/z.

Figure 3:
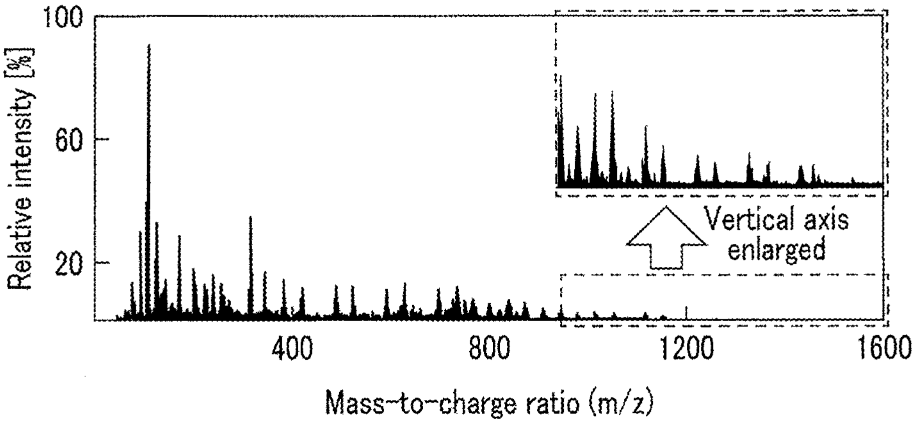
FIG. 3 is a graph showing an example mass spectrum of the byproduct.

The mass spectrum satisfying the requirement (2) will be described with reference to FIG. 3. FIG. 3 is a graph showing an example mass spectrum of the byproduct. In FIG. 3, the horizontal axis indicates a mass-to-charge ratio (m/z), and the vertical axis indicates a relative intensity (%). In FIG. 3, the upper right portion is a view of the mass spectrum part with a high mass-to-charge ratio enlarged in the vertical axis direction. In the mass spectrum shown in FIG. 3, signals belonging to ($SiCl_2$) n are detected in a range of 391 to 1545 m/z.

That is, from the requirement (1), it can be considered that the byproduct contains a substance having a molecular framework constituted by a $SiCl_2$ unit and a $SiCl_3$ unit, as a main component. From the requirement (2), it can be considered that the byproduct contains a substance having a mass ratio between silicon and chlorine of 1:2. The composition formula of such a substance is considered $(SiCl_2)_n$, where n is 3 to 15. ($SiCl_2$), is expressed as, for example, $Si_6Cl_{12}$, $Si_{14}Cl_{28}$, and $Si_{15}Cl_{30}$. As the compound having such a mass ratio, there may be the compound having either a Si═Si bond or a cyclic structure. However, since a Si═Si bond is highly unstable and immediately decomposes at ambient temperature, a substance having the above mass ratio is not considered to have a Si═Si bond, and thus considered to have a cyclic structure.

The chlorosilanes having a cyclic structure are considered to be represented by any one of the following structural formulae (a) to (d).

[Chemical Formula 1]

(a)

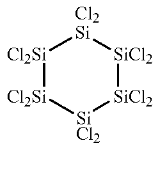

[Chemical Formula 2]

(b)

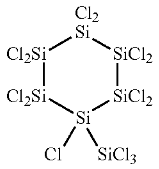

-continued

[Chemical Formula 3]

(c)

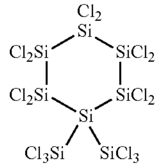

[Chemical Formula 4]

(d)

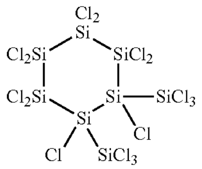

The byproduct is considered to be a mixture of chlorosilanes having a cyclic structure represented by the above structural formulae (a) to (d). The chlorosilanes having a cyclic structure represented by the above structural formulae are thermodynamically stable. However, the above chlorosilanes having a cyclic structure have a Si—Si bond and a Si—Cl bond. These bonds display high reactivity to water and oxygen. Therefore, the chlorosilanes having a cyclic structure are considered to rapidly react with water and oxygen under air atmosphere. Such chlorosilanes are considered to further react with water and oxygen to produce explosive substances.

Chlorosilanes having no cyclic structure are considered to be, for example, chain chlorosilanes.

The explosive substances are considered to be, for example, silyl ethers, siloxanes, silanols or mixtures thereof.

The byproduct may include not only the chlorosilanes having a cyclic structure but also siloxanes, chain chlorosilanes, silica, or the like. The siloxanes include a Si—O or Si—O—Si bond.

The byproduct including the siloxanes can be confirmed by Fourier transform infrared (FT-IR) spectroscopy. That is, when a peak belonging to Si—O—Si is detected in the infrared spectrum of the byproduct, the byproduct can be presumed to contain siloxanes. In the infrared spectrum, the peak belonging to Si—O—Si is detected, for example, in a range of 900 to 1700 $cm^{-1}$, and according to another example, is detected in a range of 900 to 1300 $cm^{-1}$.

Specifically, first, a byproduct is collected in the same manner as described above. Next, an infrared spectrum of the byproduct is obtained by a single-reflection attenuated total reflection (ATR) method. The infrared spectroscopic analysis is performed with an infrared spectroscopic analyzer placed in a glove box purged with nitrogen. As the infrared spectroscopic analyzer, for example, ALPHA manufactured by Bruker Optics Inc. is used. As the ATR crystal, germanium (Ge) is used. As the analysis conditions, for example, the incident angle is set to 45°, the number of integrations is set to 512, the measurement range is set to 500 to 4000 $cm^{-1}$, and the resolution is set to 4 $cm^{-1}$.

Figure 4:
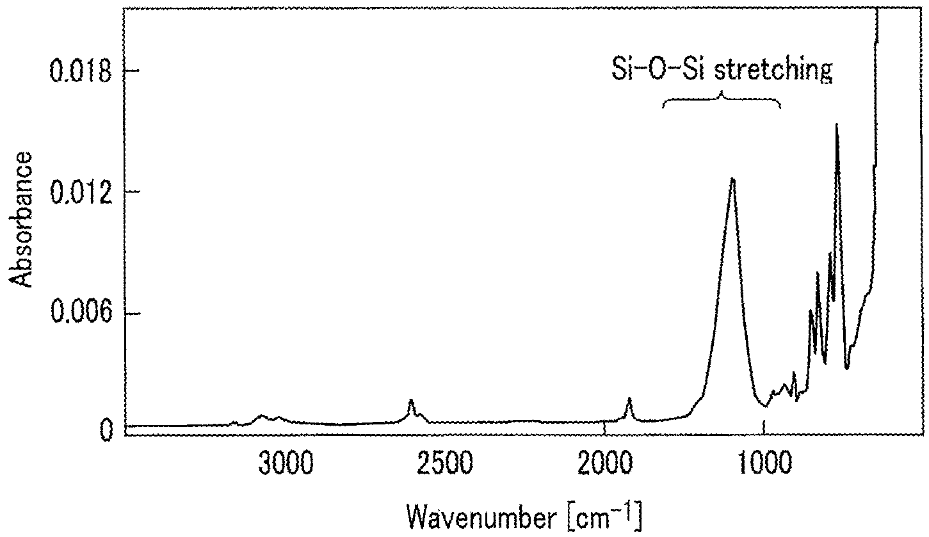
FIG. 4 is a graph showing an example infrared spectrum of the byproduct.

FIG. 4 is a graph showing an example infrared spectrum of the byproduct. In FIG. 4, the horizontal axis indicates a wavenumber ($cm^{-1}$), and the vertical axis indicates absorbance. In the infrared spectrum shown in FIG. 4, a peak belonging to Si—O—Si stretching is detected in the range of 900 to 1700 $cm^{-1}$.

The byproduct including chlorosilanes having a cyclic structure upon coming into contact with the basic treatment solution can decompose without producing an explosive substance. This is because the reaction of the chlorosilanes having a cyclic structure with the basic treatment solution cleaves the Si—Si bond and the Si—Cl bond in the chlorosilanes having a cyclic structure. Thus, the treatment solution after the reaction is almost free from explosive or flammable substances. Further, in this reaction treatment, hydrogen chloride (HCl) can be produced. Therefore, in this reaction treatment, the pH of the treatment solution tends to become low. Use of the basic treatment solution can neutralize the hydrogen chloride, and thus minimize a decrease in the pH of the treatment solution. Therefore, use of the basic treatment solution renders it possible to safely dispose of the treatment solution after the reaction.

In contrast, if the byproduct including the chlorosilanes having a cyclic structure is reacted with a neutral aqueous solution, an explosive or flammable substance may be produced. This is considered to be because if the byproduct is reacted with the neutral aqueous solution, only the surface of the byproduct would be hydrolyzed and the chlorosilanes present inside the byproduct would not decompose. Alternatively, this is considered to be because the reaction of the byproduct with water can cleave the Si—Cl bond in the byproduct through hydrolysis, but produces a product having at least one of a Si—Si bond, a Si—O—Si bond, or a Si—OH bond. Further, if a neutral or acidic aqueous solution is used, the hydrogen chloride cannot be neutralized, which may cause the pH of the treatment solution after the reaction treatment to be very low and the treatment solution after the reaction treatment to be corrosive. From the above, it would be more difficult to render the byproduct harmless in a highly safe state when using the neutral or acidic aqueous solution as compared with a basic aqueous solution.

This treatment method may be divided into 2 stages. That is, first, a pre-treatment that makes the byproduct including the chlorosilanes having a cyclic structure react with water is performed to obtain a mixed solution. Next, the mixed solution is mixed with at least one of an inorganic base or an organic base. This method also can render the byproduct harmless.

In order to make the byproduct including the chlorosilanes having a cyclic structure with the treatment solution, the byproduct is collected preferably under inert atmosphere; and in order to maintain the byproduct under inert atmosphere until immediately before the reaction, the byproduct reacts with the treatment solution preferably under inert atmosphere. Managing the byproduct under inert atmosphere renders it possible to prevent not only the inside but also the surface of a cake of the byproduct from reacting with water or oxygen. The inert gas is, for example, nitrogen gas, argon gas, or a mixed gas thereof. Under the inert atmosphere, the dew point is preferably −50° C. or less and the concentration of oxygen is preferably 10 ppm or less.

When the byproduct reacts with the treatment solution, $H_2$ gas may occur. Therefore, this treatment is preferably carried out in a facility equipped with a gas exhaust system. The mixture of the byproduct and the treatment solution is preferably subjected to an ultrasonic treatment using an ultrasonic cleaner. That is, using ultrasonic waves to vibrate the byproduct and the treatment solution can enhance the dispersibility of the byproduct in the treatment solution without using a stirring rod or the like. The frequency of the ultrasonic waves is preferably 20 kHz or more.

Here, the byproduct may be deposited on the pipe as a high-viscosity liquid substance. Therefore, in the deposit of the byproduct, the chlorosilanes having a cyclic structure on the surface of the deposit are considered to react with water or oxygen to decompose into those having no cyclic structure upon reacting. On the other hand, the chlorosilanes having a cyclic structure inside the deposit of the byproduct are less likely to come into contact with water or oxygen, and are considered to have their cyclic structure maintained even under air atmosphere. Therefore, the treatment of the byproduct using the basic treatment solution is also effective under air atmosphere.

Next, a treatment solution that can be used in this treatment method will be described.

The treatment solution is a basic aqueous solution including at least one of an inorganic base or an organic base. A concentration of the inorganic base and the organic base in the treatment solution is, for example, 0.01 mass % to 30 mass %, preferably 0.1 mass % to 10 mass %.

As the inorganic base, for example, at least one selected from the group consisting of a metal hydroxide, an alkali metal, a carbonate, a hydrogencarbonate, and a metal oxide is used.

The metal hydroxide is, for example, lithium hydroxide, sodium hydroxide, potassium hydroxide, rubidium hydroxide, cesium hydroxide, calcium hydroxide, magnesium hydroxide, copper hydroxide, iron hydroxide, zinc hydroxide, aluminum hydroxide, or a mixture thereof.

The alkali metal is, for example, a single metal that is potassium, a single metal that is lithium, a single metal that is sodium, or a mixture thereof.

The carbonate is, for example, sodium carbonate, potassium carbonate, ammonium carbonate, potassium carbonate, lithium carbonate, barium carbonate, magnesium carbonate, or a mixture thereof.

The hydrogencarbonate is, for example, sodium hydrogencarbonate, ammonium hydrogencarbonate, potassium hydrogencarbonate, calcium hydrogencarbonate, or a mixture thereof.

The metal oxide is, for example, calcium oxide, magnesium oxide, sodium oxide, or a mixture thereof.

The inorganic base includes, for example, at least one selected from the group consisting of a hydroxide of an alkali metal element, a carbonate of an alkali metal element, a hydrogencarbonate of an alkali metal element, a hydroxide of an alkaline earth metal element, a carbonate of an alkaline earth metal element, and ammonium hydroxide ($NH_4OH$).

The inorganic base is preferably at least one selected from the group consisting of sodium hydroxide (NaOH), potassium hydroxide (KOH), sodium carbonate ($Na_2CO_3$), calcium hydroxide ($Ca(OH)_2$), lithium hydroxide (LiOH), sodium hydrogencarbonate ($NaHCO_3$), and ammonium hydroxide ($NH_4OH$). Use of such an inorganic base, which is less toxic, can render it possible to treat the byproduct more safely.

The inorganic base is more preferably at least one selected from the group consisting of potassium hydroxide (KOH), sodium carbonate ($Na_2CO_3$), lithium hydroxide (LiOH), sodium hydrogencarbonate ($NaHCO_3$), and ammonium hydroxide ($NH_4OH$). Using such an inorganic base allows the reaction to proceed moderately, which can render it possible to perform the treatment more safely.

As the organic base, for example, at least one selected from the group consisting of an alkylammonium hydroxide, an organometallic compound, a metal alkoxide, an amine, and a heterocyclic amine is used.

The alkylammonium hydroxide is, for example, tetramethylammonium hydroxide, tetraethylammonium hydroxide, choline hydroxide, or a mixture thereof.

The organometallic compound is, for example, an organolithium, an organomagnesium, or a mixture thereof. The organolithium is, for example, butyllithium, methyllithium, or a mixture thereof. The organomagnesium is, for example, butylmagnesium, methylmagnesium, or a mixture thereof.

The metal alkoxide is, for example, sodium ethoxide, sodium butoxide, potassium ethoxide, potassium butoxide, sodium phenoxide, lithium phenoxide, sodium ethoxide, or a mixture thereof.

The amine is methylamine, dimethylamine, trimethylamine, triethylamine, ethylenediamine, diethylamine, aniline, or a mixture thereof.

The heterocyclic amine is pyridine, pyrrolidine, imidazole, piperidine, or a mixture thereof.

The organic base is preferably at least one selected from the group consisting of sodium phenoxide ($C_6H_5ONa$), 2-hydroxyethyltrimethylammonium hydroxide (choline hydroxide), and tetramethylammonium hydroxide (TMAH).

As the solvent of the treatment solution, water is used. As the water, pure water, ion-exchanged water, purified water, tap water, or a mixture thereof may be used.

The pH of the treatment solution is preferably 8 to 14 before and after the treatment. The pH of the treatment solution before the treatment is preferably 9 to 14, and more preferably 10 to 14.

The treatment solution may include an optional component such as a surfactant or a pH buffer in addition to the inorganic base or the organic base.

The surfactant enhances the dispersibility of the byproduct in the treatment solution and accelerates the treatment. The concentration of the surfactant in the treatment solution is, for example, 0.01 mass % to 10 mass %, and preferably 0.1 mass % to 1 mass %.

The surfactant includes, for example, at least one selected from the group consisting of an anionic surfactant, a cationic surfactant, an amphoteric surfactant, and a nonionic surfactant.

The anionic surfactant is, for example, sodium laurate, sodium stearate, sodium lauryl sulfate, sodium 1-hexanesulfonate, lauryl phosphate, or a mixture thereof.

The cationic surfactant is, for example, tetramethylammonium chloride, benzalkonium chloride, octyltrimethylammonium chloride, monomethylamine hydrochloride, butylpyridinium chloride, or a mixture thereof.

The amphoteric surfactant is, for example, lauryldimethylaminoacetic acid betaine, cocamidopropyl betaine, sodium lauroyl glutamate, lauryldimethylamine N-oxide, or a mixture thereof.

The nonionic surfactant is, for example, glycerol laurate, pentaethylene glycol onododecyl ether, polyoxyethylene sorbitan fatty ester, diethanolamide laurate, octylglucoside, cetanol, or a mixture thereof.

The surfactant preferably includes at least one of benzalkonium chloride or sodium laurate, and more preferably, benzalkonium chloride is used.

The pH buffer serves to maintain the pH of the treatment solution constant during the treatment of the byproduct. Using the pH buffer can prevent the pH of the solution after the byproduct decomposition treatment from becoming excessively high or low. Thus, through use of the pH buffer, the byproduct can be rendered harmless more safely.

The concentration of the pH buffer in the treatment solution is, for example, 0.01 mass % to 30 mass %, or preferably 0.1 mass % to 10 mass %.

As the pH buffer, a mixture of a weak acid and its conjugate base, or a mixture of a weak base and its conjugate acid can be used. Examples of the pH buffer include a mixture of acetic acid ($CH_3COOH$) and sodium acetate ($CH_3COONa$), a mixture of citric acid and sodium citrate, or a mixture of trishydroxymethylaminomethane (THAM) and ethylenediaminetetraacetic acid (EDTA).

The treatment solution according to the embodiment described above is basic. Therefore, by using the treatment solution according to the embodiment, the byproduct stemming from the process of depositing the silicon-containing material on the member using the gas which includes silicon and chlorine can be rendered harmless in a safe manner.

Although the description has been provided which takes the epitaxial growth method as an example, the above-described treatment method and treatment solution can also be applied to a byproduct stemming from a chemical vapor deposition (CVD) method other than the epitaxial growth method. The treatment method and the treatment solution can also be applied to a byproduct stemming from a method for synthesizing a silicon-containing material using a gas which includes silicon and chlorine, other than the CVD method. Examples of such a method include production of polycrystalline silicon through reduction due to hydrogen gas which includes trichlorosilane.

Although the description has been provided herein which takes the byproduct including the chlorosilanes having a cyclic structure as an example, the byproduct may contain halosilanes having a cyclic structure that include a halogen element other than chlorine.

That is, fluorine (F), bromine (Br), and iodine (I) are halogen elements, which belongs to group 17, similarly to chlorine (Cl). It is commonly known that homologous elements have similar properties. Therefore, halogen elements other than chlorine can also react with silicon in a manner similar to chlorine to produce halosilanes having a cyclic structure. The halosilanes having a cyclic structure may include a Si—Si bond and at least one bond selected from the group consisting of a Si—Cl bond, a Si—Br bond, a Si—F bond, and a Si—I bond. The halosilanes having a cyclic structure that may be included in the byproduct may contain at least one of a $SiX_y$ group or an $X_y$ group. Here, y is 1 to 3, and X is at least one selected from the group consisting of Cl, F, Br, and I.

The halosilanes having a cyclic structure may be included in a byproduct stemming from a process of depositing a silicon-containing material on a member using, for example, a gas which includes silicon and halogen. A method that causes the production of the byproduct including the halosilanes having a cyclic structure will be described below, with the epitaxial growth method described with reference to FIG. 1 taken as an example.

In the epitaxial growth apparatus 1 shown in FIG. 1, the material gas introduced into the reaction chamber 12 may contain a halogen element other than chlorine. That is, the material gas may be a mixed gas of hydrogen gas and a compound including silicon and a halogen element other than chlorine. The compound including silicon and a halogen element other than chlorine is, for example, a compound including silicon and bromine. The compound including silicon and bromine is, for example, dibromosilane ($SiH_2Br_2$), tribromosilane ($SiHBr_3$), tetrabromosilane ($SiBr_4$), or a mixture thereof. The mixed gas may contain at least one of monosilane ($SiH_4$) or hydrobromic acid (HBr).

When the material gas which includes the compound containing silicon and the halogen element other than chlorine is used in this manner, a silicon-containing film can be formed on a substrate in the same manner as when a material gas which includes a compound including silicon and chlorine is used. In addition, the byproduct that may precipitate out at the discharge pipe 13 and the connection portion 30 of the epitaxial growth apparatus 1 may include the halosilanes having a cyclic structure and including the halogen other than chlorine, for example, bromosilanes having a cyclic structure.

The mixed gas may be a gas having at least one of a compound including a halogen element other than chlorine, or a halogen gas other than chlorine mixed with a compound including silicon and chlorine and hydrogen gas. The compound including the halogen element other than chlorine may or may not include silicon. The mixed gas may be a gas having at least one of a compound including chlorine, or chlorine gas mixed with a compound including silicon and a halogen element other than chlorine and hydrogen gas. The compound including chlorine may or may not include silicon.

When the material gas which includes a chlorine element and the halogen element other than chlorine is used as described above, the byproduct that can precipitate out may include at least one compound selected from the group consisting of the chlorosilanes having a cyclic structure, the halosilanes having a cyclic structure and including halogen other than chlorine, and the halosilanes having a cyclic structure and including chlorine and the halogen element other than chlorine.

Note that the halogen element other than chlorine may inevitably be introduced into the reaction chamber 12. That is, the substrate placed in the reaction chamber 12 may be a silicon substrate having a film including the halogen element other than chlorine formed on its surface. When such a substrate is used, the halogen element included in the film formed on the surface of the silicon substrate may react with the silicon included in the material gas, which may produce halosilanes. The halosilanes are gasified in the reaction chamber 12 and discharged to the discharge pipe 13 together with the exhaust gas. In the discharge pipe 13 or the connection portion 30, the halosilanes are polymerized either with each other or with other components included in the exhaust gas, thereby leading to the possible production of the byproduct. The byproduct may include at least one compound selected from the group consisting of the chlorosilanes having a cyclic structure, the halosilanes having a cyclic structure and including the halogen other than chlorine, and the halosilanes having a cyclic structure and including chlorine and the halogen element other than chlorine.

Alternatively, the substrate placed in the reaction chamber 12 may have the halogen element other than chlorine remaining on its surface. For example, hydrofluoric acid (HF) may be used to clean a substrate such as a silicon substrate. A substrate may be subjected to a surface treatment, such as etching, with a gas including a halogen element. In such cases, a compound including the halogen element other than chlorine, such as hydrofluoric acid, may remain on the surface of the substrate. With the halogen element inevitably introduced into the reaction chamber 12 reacting with silicon in this manner, the above-described halosilanes are produced, which in turn may produce the byproduct including the halosilanes having a cyclic structure.

The halosilanes including the halogen other than chlorine and the halosilanes having a cyclic structure and including chlorine and the halogen element other than chlorine, which can be produced in the above manner, are inferred to have properties similar to those of the above-described chlorosilanes having a cyclic structure. Therefore, the halosilanes having a cyclic structure are preferably subjected to a detoxification treatment similar to that for the above-described chlorosilanes having a cyclic structure. It is considered that by making the treatment solution according to the embodiment come into contact with the halosilanes having a cyclic structure, the halosilanes having a cyclic structure can be safely rendered harmless.

The halosilanes having a cyclic structure are considered to be represented by any one of the following structural formulae (e) to (h). In the structural formulae (e) to (h), X is at least one element selected from the group consisting of F, Cl, Br, and I. The structures of the halosilanes having a cyclic structure shown below can be presumed by analyzing the byproduct using the above-described nuclear magnetic resonance (MNR) spectroscopy and mass spectrometry (MS), or the like.

[Chemical Formula 5]

(e)

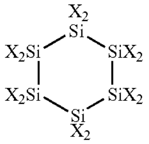

X = F, Cl, Br, I

[Chemical Formula 6]

(f)

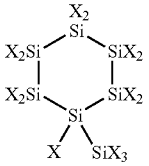

X = F, Cl, Br, I

[Chemical Formula 7]

(g)

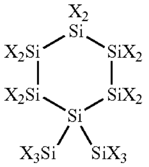

X = F, Cl, Br, I

[Chemical Formula 8]

(h)

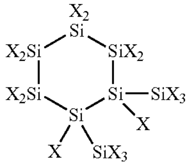

X = F, Cl, Br, I

Note that the byproduct may include siloxanes, chain halosilanes, silica, or the like in addition to the halosilanes having a cyclic structure.

Here, the halosilanes having a cyclic structure may have a 4-membered cyclic structure, a 5-membered cyclic structure, a 6-membered cyclic structure other than those represented by the structural formulae (e) to (h), a 7-membered cyclic structure, an 8-membered cyclic structure, a multi-membered cyclic structure, or the like, as shown by the following structural formulae (1) to (21). In the following structural formulae (1) to (21), X is at least one element selected from the group consisting of F, Cl, Br, and I. Note that the following structural formulae (1-1) to (21-1) respectively show the chlorosilanes of the structural formulae (1) to (21) that take chlorine as the element X.
[Chemical Formula 9]
(1-1)
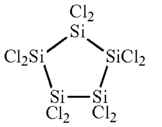
(1)
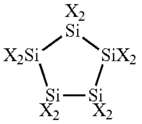
(2-1)
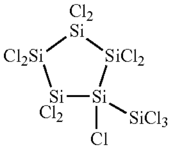
(2)
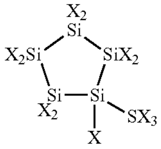
(3-1)
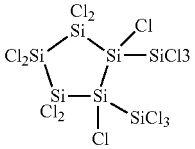
(3)
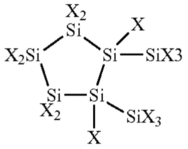
[Chemical Formula 10]
(4-1)
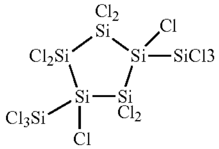
(4)
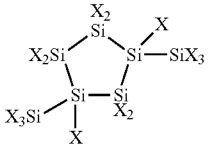
(5-1)
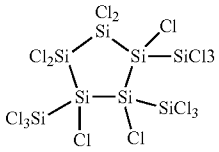
-continued
(5)
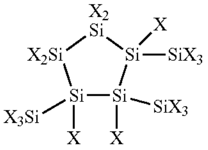
(6-1)
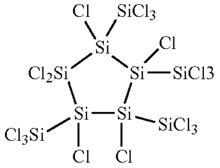
(6)
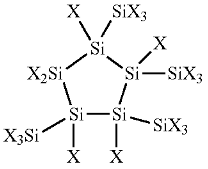
[Chemical Formula 11]
(7-1)
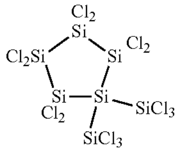
(7)
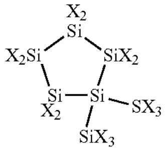
(8-1)
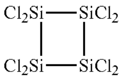
(8)
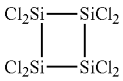
(9-1)
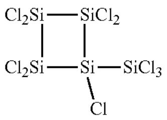
(9)
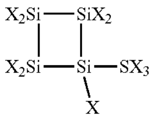
(10-1)
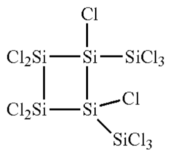

-continued
(10)
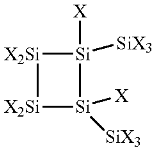
(11-1)
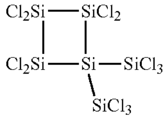
(11)
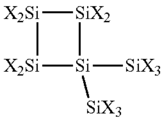
[Chemical Formula 12]
(12-1)
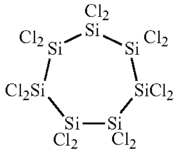
(12)
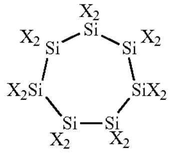
(13-1)
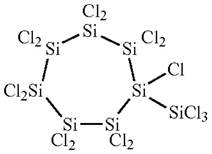
(13)
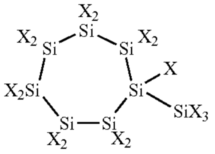
(14-1)
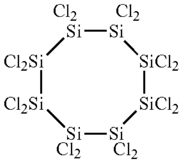
(14)
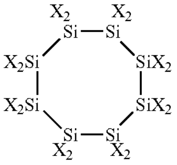
-continued
(15-1)
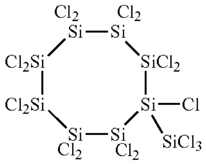
(15)
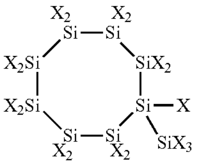
[Chemical Formula 13]
(16-1)
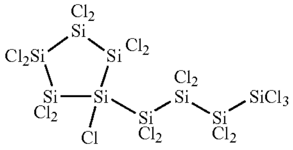
(16)
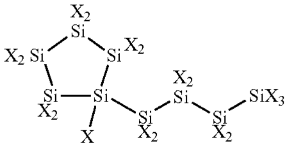
(17-1)
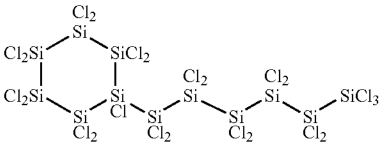
(17)
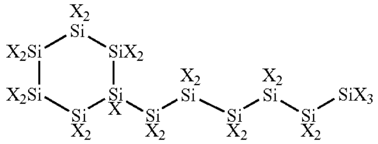
(18-1)
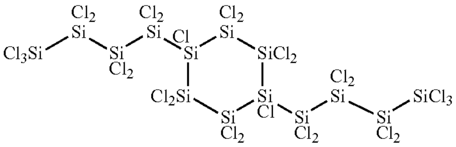
(18)
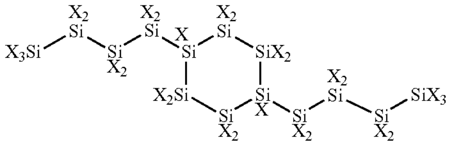
(19-1)
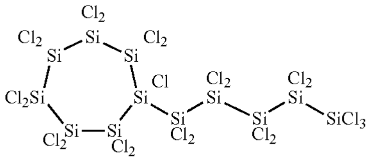

-continued (19)

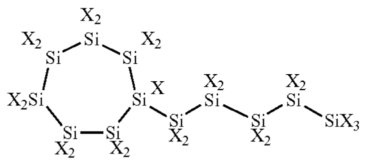

(20-1)

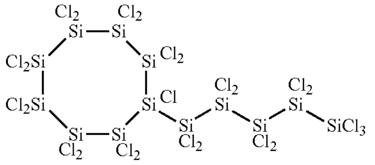

(20)

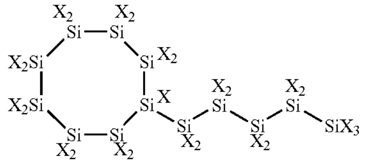

[Chemical Formula 14]

(21-1)

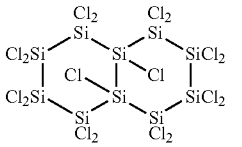

(21)

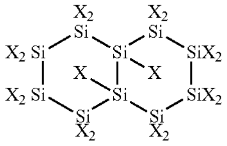

The halosilanes having a cyclic structure included in the byproduct may be homocyclic compounds having a silicon ring consisting of silicon, as shown in the above structural formulae (1) to (21), and may also be inorganic cyclic compounds free from carbon as shown in the above structural formulae (1) to (21). The byproduct may include a heterocyclic compound made of silicon and oxygen.

The halosilanes having a chain structure that may be included in the byproduct are represented, for example, by the following structural formulae (22) and (23). In the following structural formula (22), N is, for example, a positive integer of from 0 to 15. In the following structural formulae (22) and (23), X is at least one element selected from the group consisting of F, Cl, Br and I. The following structural formulae (22-1) and (23-1) respectively show the chlorosilanes of the structural formulae (22) and (23) that take chlorine as the element X.

[Chemical Formula 15]

(22-1)

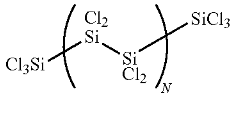

-continued (22)

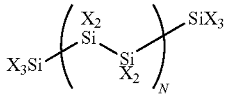

N is Positve Integer (23-1)

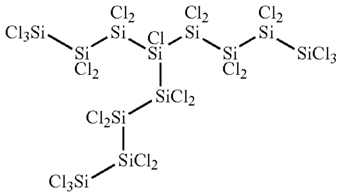

(23)

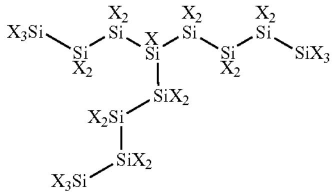

The halosilanes having a chain structure may be a linear compound having no branch as shown in the structural formula (22). Alternatively, the halosilanes having a chain structure may be a chain compound having a branch as shown in the structural formula (23). It can be presumed by mass spectrometry that the byproduct includes the halosilanes having a chain structure.

The byproduct stemming from the process of depositing the silicon-containing material on a member using the gas which includes silicon and halogen may include only the halosilanes having a cyclic structure or only the halosilanes having a chain structure as halosilane, or may include both of the halosilanes having a cyclic structure and the halosilanes having a chain structure.

The treatment solution according to the embodiment can be used as a treatment solution for treating a substance including a compound having at least one of a siloxane bond or a silanol group. Examples of the substance including the compound having at least one of a siloxane bond or a silanol group include hydrolysates of the halosilanes having a cyclic structure or a chain structure. That is, the byproduct stemming from the process of depositing the silicon-containing material on a member using the gas which includes silicon and halogen may include the hydrolysate.

The hydrolysate that may be included in the byproduct can be obtained by making the byproduct including the halosilanes having a cyclic structure or a chain structure come into contact with water or air. The hydrolysate may be in the form of a solid. The hydrolysate may be in the form of a mass or particulates.

The hydrolysate may include a compound having at least one of a siloxane bond (Si—O—Si, O—Si—O) or a silanol group (—Si—OH). The hydrolysate may also include a hydrasilanol group (—Si(H)OH). The hydrolysate having at least one of the siloxane bond or the silanol group can be presumed by nuclear magnetic resonance spectroscopy described below.

First, a byproduct is collected in the same manner as described above. Pure water is added into a petri dish including the byproduct in a fume hood under air atmosphere, thereby obtaining a mixture of the byproduct and the pure water. The amount of pure water is, for example, 1 mL for 50 mg of the byproduct. Note that the pure water is water having a specific resistance of 18.2 MΩ×cm or more. After the mixture is stirred with a spatula made of fluorocarbon resin or the like, the petri dish is covered with a lid and the mixture is left for 1 hour or more. Thereafter, the lid of the petri dish is removed, and the mixture is left for 24 hours or more at ambient temperature to allow water to volatilize from the mixture. The solid thus obtained is pulverized with a spatula made of fluorocarbon resin or the like to obtain powder. The powder is dried for 2 hours or more under reduced pressure of 5 Pa or less with a vacuum pump to obtain a measurement sample.

Next, the measurement sample is dispensed into a 3.2 mm zirconia sample tube (708239971) manufactured by JEOL Ltd. This NMR sample tube is set in an NMR spectrometer, and a $^{29}$Si NMR spectrum is measured. As the NMR spectrometer, for example, JNM-ECA800 manufactured by JEOL Ltd. can be used. In the measurement of the $^{29}$Si NMR spectrum, for example, the number of times of integration is set to 4096, and the measurement range is set to −250 to 250 ppm.

In the $^{29}$Si NMR spectrum of the hydrolysate thus obtained, a peak appearing in the range of −120 to 10 ppm is considered to be derived from at least one of a siloxane bond or a silanol group. Therefore, when the spectrum has a peak within this range, the hydrolysate can be presumed to have at least one of the siloxane bond or the silanol group.

Figure 5:
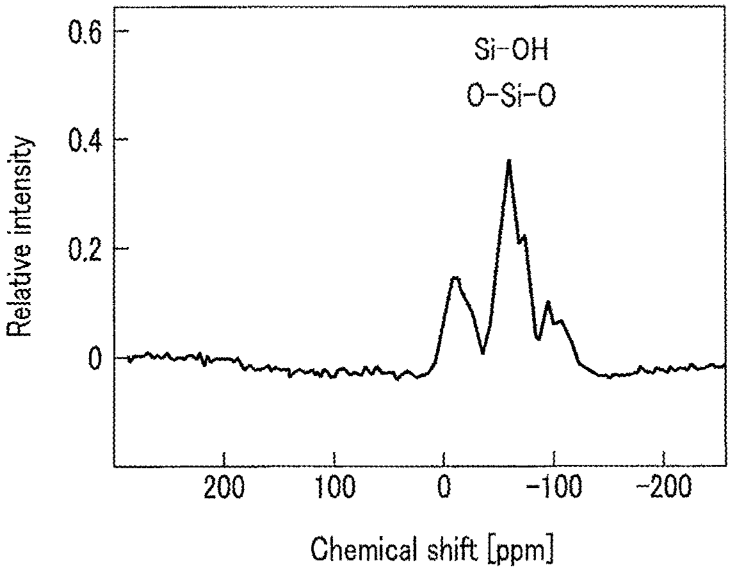
FIG. 5 is a graph showing an example $^{29}$Si NMR spectrum of a hydrolysate of the byproduct.

FIG. 5 is a graph showing an example $^{29}$Si NMR spectrum of the hydrolysate of the byproduct. In FIG. 5, the horizontal axis indicates a chemical shift (ppm), and the vertical axis indicates a relative intensity. In the $^{29}$Si NMR spectrum shown in FIG. 5, the peak with the greatest relative intensity is detected at a position of −70 ppm.

Further, by combining the analysis result of the nuclear magnetic resonance spectroscopy thus obtained with the result of the elemental analysis, the structural formula of the hydrolysate can be presumed.

In the elemental analysis, quantitative analysis is performed on carbon (C), hydrogen (H), nitrogen (N), halogen elements, and sulfur(S) included in the byproduct. The halogen elements are fluorine (F), chlorine (Cl), and bromine (Br). In the analysis of carbon, hydrogen, and nitrogen, for example, JM-11 manufactured by J-Science Lab Co., Ltd. is used. In the analysis of halogen and sulfur, for example, YHS-11 manufactured by Yanaco Corporation is used.

When the elemental analysis result obtained for the hydrolysate shows that the abundance ratio of hydrogen is 1 mass % to 10 mass % and the abundance ratio of the halogen elements is 20 mass % or less, it can be said that the amount of halogen in the byproduct has decreased and the amount of hydrogen has increased through the hydrolysis. The abundance ratio of hydrogen may be 1 mass % to 4 mass %, and the abundance ratio of the halogen elements may be 1.5 mass % or less. From the above-described result of the $^{29}$Si NMR spectrum, the increased hydrogen is considered to be derived from Si—OH bonds. Thus, the halogen in the byproduct is considered to be substituted by a hydroxyl group through the hydrolysis of the byproduct. Further, from the abundance ratio of hydrogen falling within the above-described range, the hydrolysate consisting of silicon, oxygen, and hydrogen is presumed to have the following structural formulae (24) to (29).

[Chemical Formula 16]

(24)

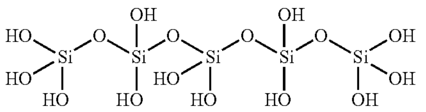

(25)

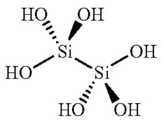

(26)

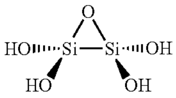

(27)

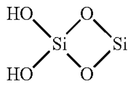

(28)

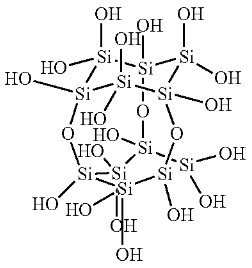

(29)

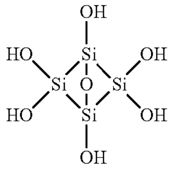

The compounds shown by the structural formulae (24) to (29) have both the siloxane bond and the silanol group. The compounds shown by the structural formulae (24) to (29) are polysilanols having two or more silanol groups.

In the compound of the structural formula (24), the abundance ratio of hydrogen is 2.961 mass %. In the compound of the structural formula (25), the abundance ratio of hydrogen is 3.82 mass %, the abundance ratio of oxygen is 60.67 mass %, and the abundance ratio of silicon is 35.50 mass %. In the compound of the structural formula (26), the abundance ratio of hydrogen is 2.88 mass %, the abundance ratio of oxygen is 57.06 mass %, and the abundance ratio of silicon is 40.07 mass %. In the compound of the structural formula (27), the abundance ratio of hydrogen is 1.65 mass %, the abundance ratio of oxygen is 52.38 mass %, and the abundance ratio of silicon is 45.97 mass %. In the compound of the structural formula (28), the abundance ratio of hydrogen is 2.63 mass %, the abundance ratio of oxygen is 48.61 mass %, and the abundance ratio of silicon is 48.76 mass %. In the structural formula (29), the abundance ratio of hydrogen is 2.63 mass %, the abundance ratio of oxygen is 48.61 mass %, and the abundance ratio of silicon is 48.76 mass %.

The siloxane bond and the Si—Si bond included in the hydrolysate of the byproduct may cause explosiveness or flammability. In particular, the cyclic siloxane bonds included in the structural formulae (26) to (29), and the cyclic silicon ring included in the structural formulae (28) and (29) upon cleaving can release large energy. Therefore, compounds including these rings are considered to exhibit flammability.

When the hydrolysate of the byproduct comes into contact with the basic treatment solution according to the embodiment, the siloxane bond and the Si—Si bond can be cleaved, which can render the hydrolysate of the byproduct harmless in a safe manner.

The treatment solution according to the embodiment described above is basic. Therefore, using the treatment solution according to the embodiment makes it possible to render the byproduct including the halosilanes having a cyclic structure harmless in a safe manner.

EXAMPLES

Hereinafter, examples will be described.

Example 1

First, a material gas was introduced into an epitaxial growth apparatus and reacted with a silicon substrate at a temperature of 800° C. to form a monocrystalline silicon film on the silicon substrate. As the material gas, a mixed gas having hydrogen gas mixed with dichlorosilane and hydrogen chloride was used. The concentration of hydrogen in the mixed gas was 95 vol % or more.

Next, the pipe of the epitaxial growth apparatus was disassembled under nitrogen atmosphere to collect a byproduct. The byproduct was a white creamy liquid. Subsequently, the collected byproduct was analyzed by the above-described method, and confirmed to include chlorosilanes having a cyclic structure considered to correspond to any one of the structural formulae (a) to (d), (1-1), (2-1), (12-1), and (14-1).

Next, 50 mg of the byproduct was weighed out and put into a petri dish in an argon-purged glove box. Subsequently, the petri dish was placed in an airtight container and moved to a fume hood under air atmosphere. The temperature in the fume hood was 26.4° C. and the humidity was 55%.

Next, a treatment solution was prepared. As the treatment solution, a solution obtained by dissolving sodium hydrogencarbonate ($NaHCO_3$) in water was used. The concentration of sodium hydrogencarbonate in the treatment solution was 10 mass %. Hereinafter, this treatment solution will be referred to as a “treatment solution TS1”.

Next, the petri dish was removed from the airtight container, and 1.0 mL of the treatment solution TS1 was added to have the byproduct react with the treatment solution TS1. As a result, fine foaming from the byproduct was confirmed. This treatment was performed while measuring the temperature of the treatment solution using a thermometer.

Example 2

The byproduct was treated in the same manner as described in Example 1, except that a treatment solution TS2 was used instead of the treatment solution TS1. As the treatment solution TS2, an aqueous solution having sodium hydrogencarbonate mixed with a pH buffer was used. As the pH buffer, a mixture of sodium acetate ($CH_3COONa$) and acetic acid ($CH_3COOH$) was used. In the treatment solution TS2, the concentration of sodium hydrogencarbonate was 10 mass %, the concentration of sodium acetate was 1 mass %, and the concentration of acetic acid was 1 mass %.

Example 3

The byproduct was treated in the same manner as described in Example 1, except that a treatment solution TS3 was used instead of the treatment solution TS1. As a result, vigorous foaming from the byproduct was confirmed. As the treatment solution TS3, a solution obtained by dissolving sodium hydroxide (NaOH) in water was used. The concentration of NaOH in the treatment solution TS3 was 10 mass %.

Example 4

The byproduct was treated in the same manner as described in Example 1, except that a treatment solution TS4 was used instead of the treatment solution TS1. As the treatment solution TS4, a solution obtained by dissolving sodium phenoxide ($C_6H_5ONa$) in water was used. The concentration of sodium phenoxide in the treatment solution TS4 was 10 mass %.

Example 5

The byproduct was treated in the same manner as described in Example 1, except that a treatment solution TS5 was used instead of the treatment solution TS1. As the treatment solution TS5, a solution obtained by dispersing calcium hydroxide ($Ca(OH)_2$) in water was used. The concentration of calcium hydroxide in the treatment solution TS5 was 10 mass %.

Example 6

The byproduct was treated in the same manner as described in Example 1, except that a treatment solution TS6 was used instead of the treatment solution TS1. As a result, the byproduct was dispersed in the treatment solution. As the treatment solution TS6, an aqueous solution having sodium hydroxide mixed with a surfactant was used. As the surfactant, benzalkonium chloride was used. In the treatment solution TS6, the concentration of sodium hydroxide was 10 mass %, and the concentration of benzalkonium chloride was 1 mass %.

Example 7

The byproduct was treated in the same manner as described in Example 1, except that handled under inert gas atmosphere so as not to come into contact with oxygen or water.

Example 8

The byproduct was treated in the same manner as described in Example 6, except handled under inert gas atmosphere so as not to come into contact with oxygen or water.

Example 9

The byproduct was treated in the same manner as described in Example 2, except handled under inert gas atmosphere so as not to come into contact with oxygen or water.

Comparative Example 1

The byproduct was treated in the same manner as described in Example 1, except that water was used instead of the treatment solution TS1.

Comparative Example 2

The byproduct was treated in the same manner as described in Example 1, except that a treatment solution TS7 was used instead of the treatment solution TS1. As the treatment solution TS7, a solution obtained by dissolving hydrogen peroxide ($H_2O_2$) in water was used. The concentration of hydrogen peroxide in the treatment solution TS7 was 10 mass %.

Comparative Example 3

The byproduct was treated in the same manner as described in Comparative Example 1, except that the bottom of the petri dish was heated to 50° C. with a heater after water was added to the petri dish.

Comparative Example 4

The byproduct was treated in the same manner as described in Comparative Example 1, except that an ultrasonic treatment was performed using an ultrasonic cleaner after water was added to the petri dish. The ultrasonic treatment was performed at a frequency of 28 kHz.

Comparative Example 5

The byproduct was treated in the same manner as described in Comparative Example 1, except that the mass of the byproduct on the petri dish was pulverized with a spatula after water was added to the petri dish.

Comparative Example 6

The byproduct was treated in the same manner as described in Example 1, except that a treatment solution TS8 was used instead of the treatment solution TS1. As the treatment solution TS8, a solution obtained by dissolving benzalkonium chloride in water was used. As a result, the byproduct was dispersed in the treatment solution.

Example 10

The byproduct was treated in the same manner as described in Example 1, except that after the treatment solution TS1 was added to the petri dish, an ultrasonic treatment was performed using an ultrasonic cleaner. The ultrasonic treatment was performed at a frequency of 28 kHz.

Example 11

The byproduct was treated in the same manner as described in Example 5, except that an ultrasonic treatment was performed using an ultrasonic cleaner after the treatment solution TS5 was added to the petri dish. The ultrasonic treatment was performed at a frequency of 28 kHz.

Example 12

The byproduct was treated in the same manner as described in Example 1, except that a treatment solution TS9 was used instead of the treatment solution TS1. As the treatment solution TS9, a solution obtained by dissolving tetramethylammonium hydroxide (TMAH) in water was used. The concentration of TMAH in the treatment solution TS9 was 25 mass %.

Example 13

First, 50 mg of the byproduct was weighed out and put into a petri dish in the same manner as described in Example 1. Then, 1.0 mL of water was dropped into the petri dish and left for 1 hour. Subsequently, 1.0 mL of the treatment solution TS9 was dropped into the petri dish. The byproduct was treated in this way. The elemental analysis of the byproduct and the elemental analysis of the byproduct, that is, the hydrolysate, after the water treatment and before the treatment with the treatment solution TS9, were performed by the method described later.

Example 14

The byproduct was treated in the same manner as described in Example 1, except that a treatment solution TS10 was used instead of the treatment solution TS1. As the treatment solution TS10, a solution obtained by dissolving tetramethylammonium hydroxide (TMAH) in water was used. The concentration of TMAH in the treatment solution TS10 was 5 mass %.

Example 15

The byproduct was treated in the same manner as described in Example 1, except that a treatment solution TS11 was used instead of the treatment solution TS1. As the treatment solution TS11, a solution obtained by dissolving tetramethylammonium hydroxide (TMAH) in water was used. The concentration of TMAH in the treatment solution TS11 was 0.26 mass %. As a result, the temperature of the treatment solution during the treatment of the byproduct did not increase.

Example 16

The byproduct was treated in the same manner as described in Example 1, except that a treatment solution TS12 was used instead of the treatment solution TS1. As the treatment solution TS12, a solution obtained by dissolving choline hydroxide in water was used. The concentration of choline hydroxide in the treatment solution TS12 was 4 mass %.

(Measurement of pH)

The pHs of the treatment solutions before and after the treatment of the byproducts were measured using a pH-test paper. The results are shown in Table 1.

(Friction Sensitivity Test and Flame Sensitivity Test)

Whether or not the treatment solutions after the treatment of the byproducts include a flammable solid was examined via the following method.

First, the treatment solution after each test was sufficiently dried in an exhaust booth. Next, a small amount of the solids remaining on the petri dish was dispensed into a container made of Steel Special Use Stainless (SUS). Subsequently, the solids were moved on the petri dish with a spatula made of SUS pressed on the solids. Whether or not the solids ignite was visually examined at this time.

In addition, it was visually examined whether or not the solids ignite when the solids dispensed into the SUS container were made to come into contact with a flame using a portable ignition device. As the gas for the portable ignition device, butane gas was used. The temperature of the flame was about 500° C.

The test results are summarized in Table 1 below.

the solids ignited when friction was applied to the solids is shown. In the column labeled "Flame Sensitivity Test", whether or not the solids ignited when the flame come close to the solids is shown.

TABLE 1

| | Treatment Solution | | | | | During Treatment Maximum Temperature (° C.) | After Treatment pH | Treatment Method | Evaluation Friction Sensitivity Test | Evaluation Flame Sensitivity Test |
|---|---|---|---|---|---|---|---|---|---|---|
| | Salt/Acid | Concentration (mass %) | Surfactant | pH Buffer | pH | | | | | |
| Example 1 | $NaHCO_3$ | 10 | N/A | N/A | 9 | 33.3 | 8 | — | No | No |
| Example 2 | $NaHCO_3$ | 10 | N/A | $CH_3COONa$/ $CH_3COOH$ | 9 | 35.5 | 8 | — | No | No |
| Example 3 | NaOH | 10 | N/A | N/A | 14 | 53.0 | 14 | — | No | No |
| Example 4 | $C_5H_5ONa$ | 10 | N/A | N/A | 14 | 33.3 | 9.5 | — | No | No |
| Example 5 | $Ca(OH)_2$ | 10 | N/A | N/A | 14 | 43.3 | 14 | — | No | No |
| Example 6 | NaOH | 10 | Benzalkonium chloride | N/A | 14 | 40.2 | 14 | — | No | No |
| Example 7 | $NaHCO_3$ | 10 | N/A | N/A | 9 | 33.3 | 8 | Inert atmosphere | No | No |
| Example 8 | NaOH | 10 | Benzalkonium chloride | N/A | 14 | 40.2 | 14 | Inert atmosphere | No | No |
| Example 9 | $NaHCO_3$ | 10 | N/A | $CH_3COONa$/ $CH_3COOH$ | 9 | 35.5 | 8 | Inert atmosphere | No | No |
| Comparative Example 1 | N/A | 0 | N/A | N/A | 7 | 32.4 | 1 | — | No | Yes |
| Comparative Example 2 | $H_2O_2$ | 10 | N/A | N/A | 5 | 43.2 | 1 | — | No | No |
| Comparative Example 3 | N/A | 0 | N/A | N/A | 7 | 50.0 | 1 | Heating | No | Yes |
| Comparative Example 4 | N/A | 0 | N/A | N/A | 7 | 32.4 | 1 | Ultrasound | No | Yes |
| Comparative Example 5 | N/A | 0 | N/A | N/A | 7 | 32.4 | 1 | Pulverization | No | Yes |
| Comparative Example 6 | N/A | 0 | Benzalkonium chloride | N/A | 7 | 30.3 | 1 | — | No | Yes |
| Example 10 | $NaHCO_3$ | 10 | N/A | N/A | 9 | 33.3 | 8 | Ultrasound | No | No |
| Example 11 | $Ca(OH)_2$ | 10 | N/A | N/A | 14 | 43.3 | 14 | Ultrasound | No | No |
| Example 12 | TMAH | 25 | N/A | N/A | 14 | 33 | 14 | — | No | No |
| Example 13 | TMAH | 25 | N/A | N/A | 14 | 27.5 | 14 | Two-step Treatment | No | No |
| Example 14 | TMAH | 5 | N/A | N/A | 14 | 25.8 | 14 | — | No | No |
| Example 15 | TMAH | 0.26 | N/A | N/A | 12 | 17.8 | 12 | — | No | No |
| Example 16 | Choline hydroxide | 4 | N/A | N/A | 14 | 22.3 | 14 | — | No | No |

In Table 1, the type of the salt or acid included in the treatment solution is shown in the column labeled "Salt/Acid" under the heading "Treatment Solution". In the column labeled "Concentration (mass %)", the concentration of the salt or acid included in the treatment solution is shown. In the column labeled "Surfactant", the type of the surfactant included in the treatment solution is shown. In the column labeled "pH Buffer", the type of the pH buffer included in the treatment solution is shown. In the column labeled "pH", the pH of the treatment solution before the treatment of the byproduct is shown.

In Table 1 above, the highest temperature reached by the treatment solution during the treatment of the byproduct is shown in the column labeled "Maximum Temperature (° C.)" under the heading "During Treatment". In addition, in the column labeled "pH" under the heading "After Treatment", the pH of the treatment solution after treatment of the byproduct is shown. In addition, in the column under the heading "Treatment Method", the characteristics of the treatment method are shown.

In Table 1 above, in the column labeled "Friction Sensitivity Test" under the heading "Evaluation", whether or not As shown in Table 1 above, according to the methods of Examples 1 to 16, the pHs of the treatment solutions after the treatment were 7 or more, and the solids obtained by drying the treatment solutions after the treatment did not display flammability or explosiveness. In contrast, according to the treatment methods of Comparative Examples 1 to 6, the pHs of the treatment solutions after the treatment were 1 or less. In addition, according to the treatment methods of Comparative Examples 1 and 3 to 6, the solids obtained by drying the treatment solutions after the treatment displayed flammability.

In addition, as shown in Table 1, the highest temperature during the treatment was lower and the pH after the treatment was close to neutral when the treatment solution TS1, including $NaHCO_3$, or the treatment solution TS4, including $C_6H_5ONa$, was used than when the treatment solution TS3, including NaOH, and the treatment solution TS5, including $Ca(OH)_2$, were used.

(Elementary Analysis)

The byproducts obtained in the Examples and the hydrolysate of the byproduct obtained in Example 13 were subjected to an elementary analysis by the method described above. The results are shown in Table 2.

TABLE 2

| | Abundance Ratio (mass %) | |
|---|---|---|
| | Byproduct | Hydrolysate |
| Carbon | 0 | 0 |
| Hydrogen | 0.131 | 2.616 |
| Nitrogen | 0 | 0 |
| Fluorine | 0 | 0.07 |

TABLE 2-continued

| | Abundance Ratio (mass %) | |
|---|---|---|
| | Byproduct | Hydrolysate |
| Chlorine | 69.49 | 1.03 |
| Bromine | 0 | 0 |
| Sulfur | 0 | 0 |

It can be seen from Table 2 that by making the byproduct come into contact with water to hydrolyze, the byproduct will exhibit a decreased amount of chlorine and an increased amount of hydrogen. As shown in Table 2, trace amounts of fluorine and chlorine were detected from the hydrolysate. This fluorine is considered to be derived from the impurity inevitably introduced. The chlorine is considered to be derived from hydrogen chloride attached to the surface of the hydrolysate.

Example 17

First, a monocrystalline silicon film was formed under the same conditions as those described in Example 1 except that the reaction temperature was changed from 800° C. to 1000° C. Next, the pipe of the epitaxial growth apparatus was disassembled under nitrogen atmosphere to collect a byproduct. The byproduct was in the form of a pale yellow oil. The collected byproduct was analyzed by the above-described method, and the byproduct was presumed to include the chlorosilanes having a cyclic structure considered to correspond to any one of the structural formulae (a) to (d), (1-1), (2-1), (12-1), and (14-1) and the chlorosilanes having a chain structure considered to correspond to any one of the structural formulae (22-1) and (23-1).

Next, 50 mg of the byproduct was weighed out and put into a petri dish in an argon-purged glove box. The petri dish was placed in an airtight container and moved to a fume hood under air atmosphere. The temperature in the fume hood was 25.3° C. and the humidity was 50%.

Next, the petri dish was taken out from the airtight container, and 1.0 mL of the treatment solution TS1 was added into the petri dish to have the byproduct react with the treatment solution TS1. As a result, fine foaming from the byproduct was confirmed. This treatment was performed while measuring the temperature of the treatment solution using a thermometer.

Further, the pH of the treatment solution before and after the treatment of the byproduct was measured using a pH-test paper. The solids after the treatment were subjected to a friction sensitivity test and a flame sensitivity test in the same manner as described above. The results are shown in Table 3.

TABLE 3

| | Treatment Solution | | | | | During Treatment | After Treatment | | Evaluation | |
|---|---|---|---|---|---|---|---|---|---|---|
| | Salt/Acid | Concentration (mass %) | Surfactant | pH Buffer | pH | Maximum Temperature (° C.) | Treatment pH | Treatment Method | Friction Sensitivity Test | Flame Sensitivity Test |
| Example 17 | $NaHCO_3$ | 10 | N/A | N/A | 9 | 32.5 | 8 | — | No | No |

As is clear from Table 3 above, the chlorosilanes considered to have a chain structure, similarly to the chlorosilanes considered to have a cyclic structure, were successfully rendered harmless using the treatment solution according to the embodiment.

According to at least one of the embodiments described above, there is provided the treatment solution for treating the byproduct stemming from the process of depositing the silicon-containing material on a member using the gas which includes silicon and a halogen such as chlorine. The above treatment solution includes at least one of an inorganic base or an organic base, and is basic. Therefore, use of the above treatment solution renders it possible to treat, in a highly safe manner, the halosilanes having a cyclic structure, such as the chlorosilanes having a cyclic structure, that are included in the byproduct stemming from the process of depositing a silicon-containing material on a member using the gas which includes silicon and halogen such as chlorine.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Hereinafter, the inventions according to the original claims of the prior application will be added.

[1]

A treatment solution for treating a byproduct stemming from a process of depositing a silicon-containing material on a substrate using a gas which includes silicon and chlorine, the treatment solution including at least one of an inorganic base or an organic base and being basic.

[2]

The treatment solution according to [1] including the inorganic base, wherein the inorganic base is at least one selected from the group consisting of sodium hydroxide (NaOH), potassium hydroxide (KOH), sodium carbonate ($Na_2CO_3$), calcium hydroxide ($Ca(OH)_2$), lithium hydroxide (LiOH), sodium hydrogencarbonate ($NaHCO_3$), and ammonium hydroxide ($NH_4OH$).

[3]

The treatment solution according to [1] or [2] including the inorganic base, wherein the inorganic base is at least one selected from the group consisting of potassium hydroxide (KOH), sodium carbonate ($Na_2CO_3$), lithium hydroxide (LiOH), sodium hydrogencarbonate ($NaHCO_3$), and ammonium hydroxide ($NH_4OH$).

[4]

The treatment solution according to any of [1] to [3] including the organic base, wherein the organic base includes at least one selected from the group consisting of alkylammonium hydroxides, an organometallic compound, a metal alkoxide, an amine, and a heterocyclic amine.

[5]

The treatment solution according to any of [1] to [4] including the organic base, wherein the organic base is at least one selected from the group consisting of sodium phenoxide ($C_6H_5ONa$), 2-hydroxyethyltrimethylammonium hydroxide (choline hydroxide), and tetramethylammonium hydroxide (TMAH).

[6]

The treatment solution according to any of [1] to [5], wherein the treatment solution has a pH value of 8 to 14.

[7]

The treatment solution according to any of [1] to [6], wherein the treatment solution further includes a surfactant.

[8]

The treatment solution according to [7], wherein the surfactant is a cationic surfactant.

[9]

A treatment method using the treatment solution according to any of [1] to [8], the method including making the byproduct come into contact with the treatment solution.

The treatment method according to [9], including, after making the byproduct come into contact with the treatment solution, performing an ultrasonic treatment on the resulting mixture. Note that the member may include a substrate.

What is claimed:

1. A treatment method, comprising:

making a byproduct come into contact with a treatment solution in an air atmosphere, wherein the byproduct is a solid or liquid byproduct formed by polymerizing components contained in an exhaust gas discharged by synthesizing a silicon-containing material using a gas which includes silicon and halogen, and wherein the treatment solution comprises at least one of an inorganic base or an organic base, and is basic.

2. The method of claim 1, wherein the treatment solution comprises the inorganic base, and wherein the inorganic base comprises at least one selected from the group consisting of a metal hydroxide, an alkali metal, a carbonate, a hydrogencarbonate, and a metal oxide.

3. The method of claim 1, wherein the treatment solution comprises the inorganic base, and wherein the inorganic base comprises at least one selected from the group consisting of sodium hydroxide (NaOH), potassium hydroxide (KOH), sodium carbonate ($Na_2CO_3$), calcium hydroxide ($Ca(OH)_2$), lithium hydroxide (LiOH), sodium hydrogencarbonate ($NaHCO_3$), and ammonium hydroxide ($NH_4OH$).

4. The method of claim 1, wherein the treatment solution comprises the organic base, and wherein the organic base comprises at least one selected from the group consisting of alkylammonium hydroxides, an organometallic compound, a metal alkoxide, an amine, and a heterocyclic amine.

5. The method of claim 1, wherein the treatment solution comprises the organic base, and wherein the organic base comprises at least one selected from the group consisting of sodium phenoxide ($C_6H_5ONa$), 2-hydroxyethyltrimethylammonium hydroxide (choline hydroxide), and tetramethylammonium hydroxide (TMAH).

6. The method of claim 1, wherein the gas which includes silicon and halogen is a gas including silicon and chlorine.

7. The method of claim 1, wherein the byproduct comprises a compound having at least one of a siloxane bond or a silanol group.

8. A treatment method, comprising:

making a byproduct come into contact with a treatment solution; and then performing an ultrasonic treatment on a resulting mixture, wherein the byproduct is a solid or liquid byproduct formed by polymerizing components contained in an exhaust gas discharged by synthesizing a silicon-containing material using a gas which includes silicon and halogen, and wherein the treatment solution comprises at least one of an inorganic base or an organic base, and is basic.

* * * * *